(12) United States Patent
Kelly

(10) Patent No.: US 7,027,945 B2
(45) Date of Patent: Apr. 11, 2006

(54) METHOD OF SELF-CALIBRATION OF PULSE RISE AND FALL TIMES

(75) Inventor: Christopher P. J. Kelly, Loveland, CO (US)

(73) Assignee: Agilent Technologies, Inc., Palo Alto, GA (US)

( * ) Notice: Subject to any disclaimer, the term of this patent is extended or adjusted under 35 U.S.C. 154(b) by 105 days.

(21) Appl. No.: 10/743,602

(22) Filed: Dec. 22, 2003

(65) Prior Publication Data

US 2005/0134370 A1 Jun. 23, 2005

(51) Int. Cl.
*G01R 35/00* (2006.01)
*G01R 15/00* (2006.01)
*G01R 19/00* (2006.01)

(52) U.S. Cl. .......................... 702/107; 702/57; 702/64

(58) Field of Classification Search ................ 702/107, 702/85, 57, 64, 66, 67; 324/76.12
See application file for complete search history.

(56) References Cited

U.S. PATENT DOCUMENTS 5,436,880 A * 7/1995 Eastman et al. ......... 369/47.51

* cited by examiner

*Primary Examiner*—John Barlow
*Assistant Examiner*—Meagan S Walling

(57) ABSTRACT

An instrument which utilizes this invention is a pulse generator which has adjustable rise and fall time. The generation of timing of pulses is under control of a digital circuit, and the timing of the beginning and end of each pulse and thus duty cycle is precise. The pulse generator also has an analog-to-digital converter that is used to measure voltages internal to the instrument. Voltage measurements are used to calculate the rise and fall times of the pulses. The rise and fall time of the pulses are adjusted based upon mathematical calculations. Control of rise and fall times is implemented using circuitry internal to the pulse generator. Rise time and fall time circuitry adjusts the rate of change of voltage (dv/dt) on the pulses generated. Rise time and fall time are independently adjustable.

45 Claims, 3 Drawing Sheets

METHOD OF SELF-CALIBRATION OF PULSE RISE AND FALL TIMES

FIELD OF THE INVENTION

This invention relates generally to the field of calibration of electronic test equipment. More particularly, this invention relates to automatic calibration of electronic test equipment and describes structure which performs automatic calibration of pulse generator rise and fall times and methods therefore.

BACKGROUND

The need to know that pulse rise and fall times are within specification is basic to the use of pulses in measurement and test applications. The extent to which pulse rise and/or fall times affects the desired device under test performance depends on the nature of the device and the type of test to be performed.

Most pulse generators do not provide for individual rise and fall time self-contained verification, nor do they provide for independent rise and fall time automatic self-contained adjustment. Such equipment normally requires that pulse rise and fall time verification be performed using an external oscilloscope and an automated test equipment controller or a trained operator.

One disadvantage of this solution is the requirement for an oscilloscope (additional expense) and for either an automated test controller (dedicated computer and software) or a trained operator. A second disadvantage is that the operation of the rise and fall time circuit may be affected by operating temperature or component aging, and may require continual or frequent correction. If a relatively complex measurement or procedure is required to adjust for these effects, the user may find the adjustment inconvenient and operate the instrument in a less than optimal condition.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
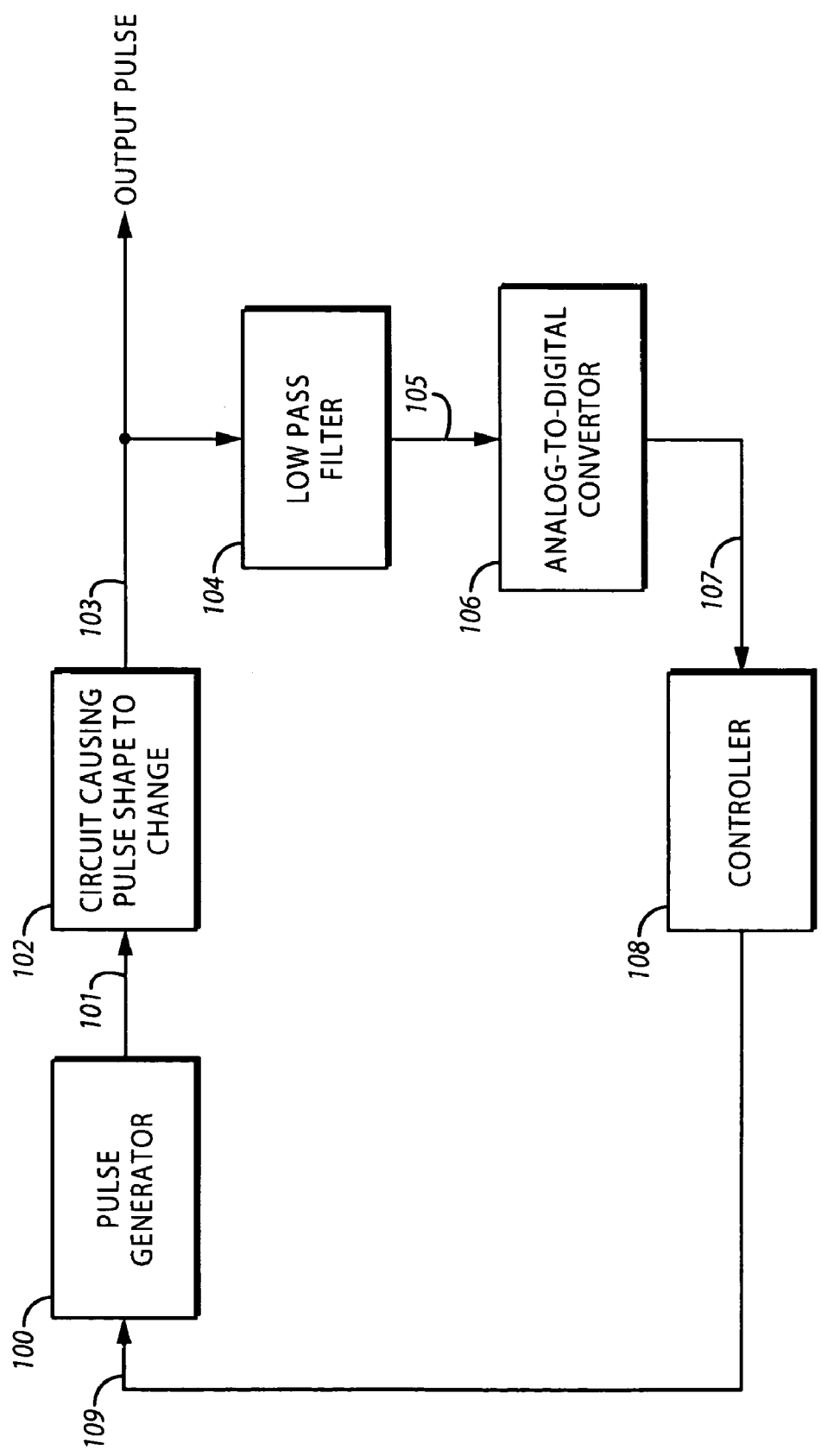
FIG. 1 is an exemplary simplified block diagram of the rise and fall time measurement and adjustment technique, in accordance with certain embodiments of the present invention.

A method and structure for automatically measuring the values of rise and fall time of a pulse generator is presented, in accordance with certain embodiments of the present invention. This measurement technique may be self-contained within the pulse generator.

A method and structure for automatically independently correcting the values of rise and fall times of a pulse generator is presented, in accordance with certain embodiments of the present invention. This measurement technique may be self-contained within the pulse generator, and it may be run periodically for correction of environmental and aging effects.

Many variations, equivalents and permutations of these illustrative exemplary embodiments of the invention will occur to those skilled in the art upon consideration of the description that follows. The particular examples above should not be considered to define the scope of the invention. For example measuring the values of rise and fall time may be used without any rise and fall time correction. A further example would be a physical separation of the point at which the rise and fall time measurement is made, and the point at which the rise and fall time correction is implemented, such as in a system where each function occurs in different equipments. A further example would be using either rise or fall time features of the present invention, but not both.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

For purposes of this document, the exact mechanical and electrical parameters of equipments are unimportant to an understanding of the invention, and many different types of electrical and mechanical components may be utilized without departing from the spirit of the invention. An example is that the required rise and fall time accuracy will depend upon the application at hand and may vary between otherwise similar equipments in the same system. This document uses generalized descriptions by way of example only. Many variations for these constituent items are possible without departing from the spirit and scope of the invention.

In accordance with certain embodiments of the invention a measurement of average voltage of a waveform, together with a mathematical description of that waveform, is used to calculate the parameters of the mathematical equation that describe the waveform. Average voltage of a waveform is relatively simple to measure, compared to measuring parameters of interest directly with more complex and costly instrumentation. By making measurement of the average voltage of waveforms generated by the pulse generator, the waveform characteristic of interest can be deduced.

Refer to FIG. 1, which is an exemplary simplified block diagram of the rise and fall time measurement and adjustment technique. Pulse generator 100, which is capable of generating pulses with variable timing characteristics, is commanded by controller 108 to generate pulse generator output 101 with known timing characteristics. These pulses pass through pulse shaping circuit 102 that may cause the pulse shape to change in a manner which will be described. The changes may be intentionally caused by pulse shaping circuit 102 or may be incidental to the cabling, switching and other circuit elements comprising pulse shaping circuit 102 and the physical path of pulse generator output 101. The characteristics of the resulting output 103 are what are to be measured by the invention.

A portion of output 103 is sent to a low pass filter 104 which removes Alternating Current (AC) components and puts out a Direct Current (DC) signal, lowpass filter output 105, whose amplitude is equal to the average voltage of output 103. Lowpass filter output 105 is routed to the input of analog-to-digital converter (A/D converter) 106, which generates a digital signal at A/D converter output 107 which represents the average voltage of output 103. A/D converter output 107 is sent to controller 108 which uses sequential measurements to calculate the waveform characteristics of interest, in a manner described later. At each step of the measurement procedure controller 108 sends pulse generator control signal 109 to pulse generator 100 so as to output pulses of the required type for the next step of the measurement.

After all required measurements have been made and recorded by controller 108, the controller uses the set of measurement results to calculate the waveform parameters of interest using mathematical equations that describe the waveform.

Figure 2:
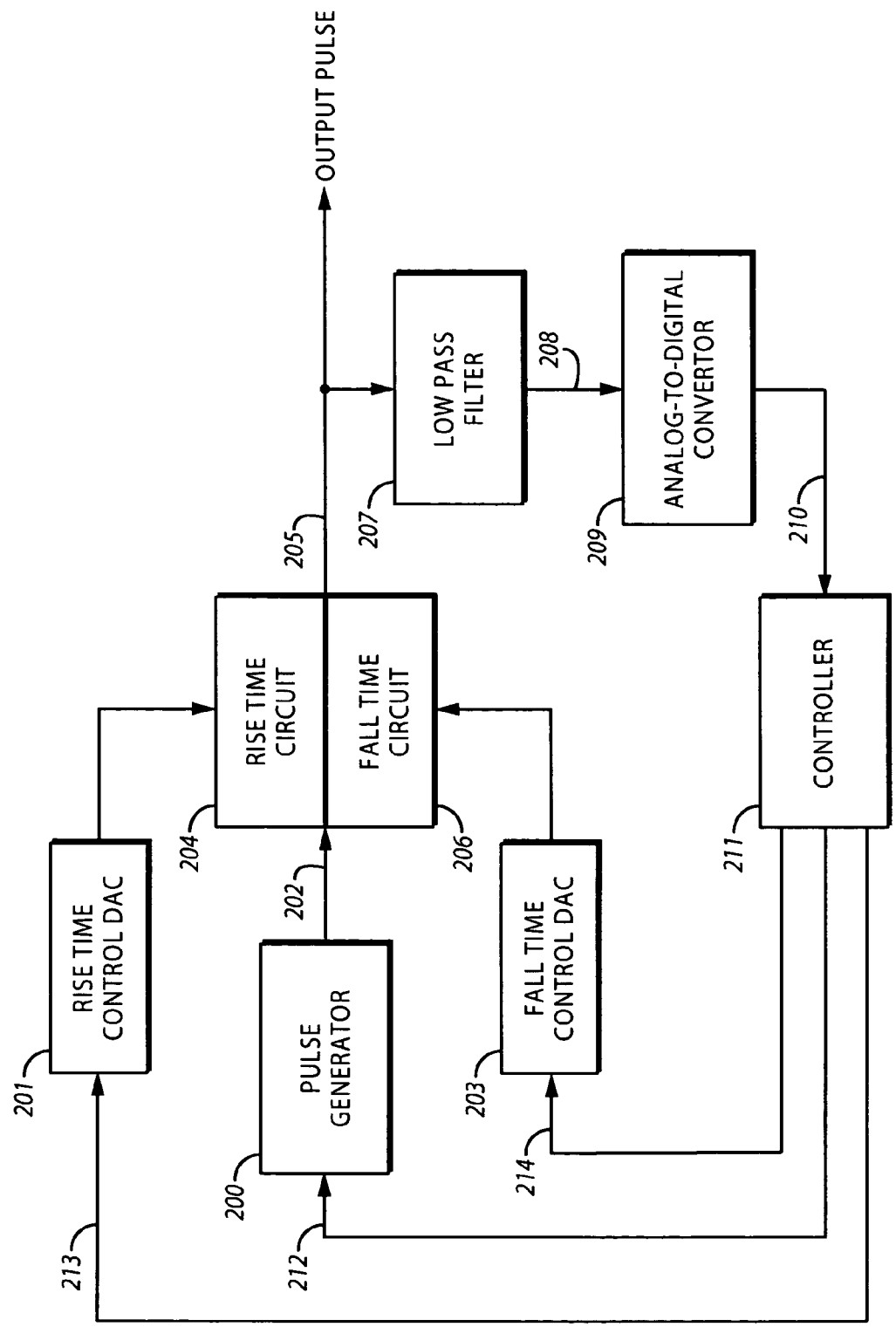
FIG. 2 is an exemplary block diagram of the rise and fall time measurement and adjustment technique, in accordance with certain embodiments of the present invention.

Refer to FIG. 2, in which an exemplary block diagram of the rise and fall time measurement and adjustment technique is shown, in accordance with certain embodiments of the present invention. The generation of the timing of pulse generator 200 pulses (pulse ON duration, pulse OFF duration) is under the control of controller 211 via pulse generator control signal 212. The timing of the beginning and end of each pulse, and waveform duty cycle, is under precise control of digital circuitry in controller 211 and pulse generator 200, as are pulse frequency and pulse amplitude. This characteristic is one component of the method utilized by the present invention: pulse duty cycle, amplitude, and frequency are well known and accurately controlled.

Pulse generator output 202 generated by pulse generator 200 is routed to a circuit composed of two parts, a rise time circuit 204 and a fall time circuit 206. These circuits are respectively under the control of a rise time D/A converter 201 and a fall-time D/A converter 203 which control the rate of rise of voltage and the rate of fall of voltage of the pulse waveform.

The output of the rise and fall time adjustment circuitry is output 205. The basic challenge of this invention is to measure the rise time and fall time of output 205 in order to provide corrective feedback to rise time D/A converter 201 and fall time D/A converter 203 which will accurately control the rise and fall times of output 205.

Lowpass filter 207 removes AC components of output 205, and lowpass filter output 208 is a DC signal representing the average voltage of output 205.

A/D converter 209 measures the output of lowpass filter 207. The output of A/D converter 209 is A/D converter output 210, a digital signal which is routed to controller 211. A/D converter output 210 is used by controller 211 to calculate the rise and fall times of output 205, using methods described in this document.

Controller 211 contains software that generates control signals 212, 213, and 214. Pulse generator control signal 212 is routed to pulse generator 200, and controls the frequency, amplitude, and duty cycle of pulses output by pulse generator 200, which is pulse generator output 202. D/A converter control signal 213 is routed to rise time D/A converter 201, and provides rise time control. D/A converter control signal 214 is routed to fall time D/A converter 203 to provide fall time control. D/A converters are shown for example only; other interfaces may be utilized, depending on the nature of the rise/fall time circuitry and equipment design requirements. Other examples of interfaces are varicaps, motor driven capacitors, switched capacitors, and variable resistance devices.

Rise time circuit 204 affects the rise time of output 205, and is under the control of rise time D/A converter 201. Fall time circuit 206 affects the fall time of output 205, and is under the control of fall time D/A converter 203. Rise time and fall time are independently adjustable.

Figure 3:
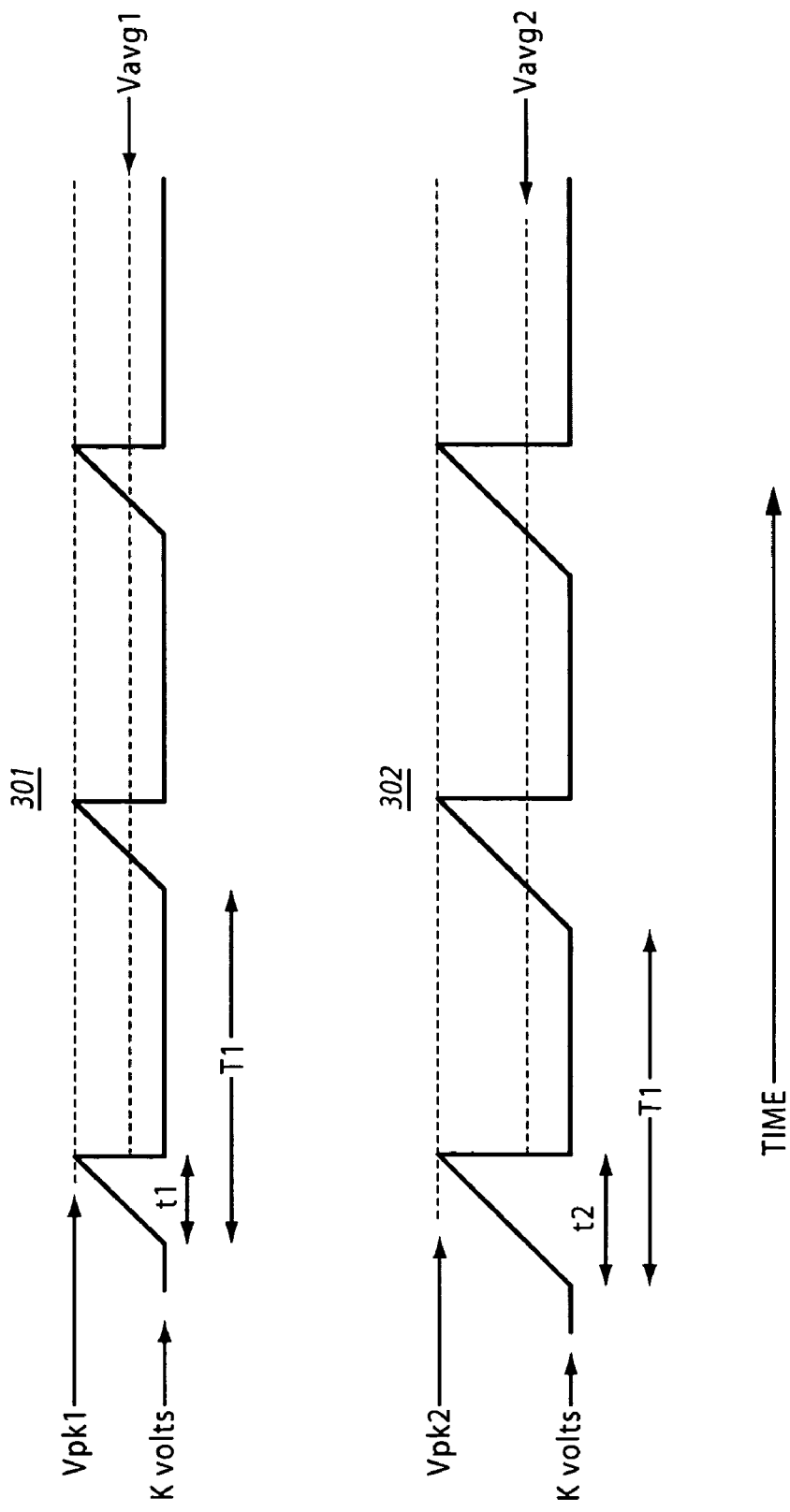
FIG. 3 is an exemplary waveform diagram to aid understanding of the rise and fall time measurement and adjustment technique, in accordance with certain embodiments of the present invention.

The self-calibration method uses a series of waveforms to calculate rise and fall time from the DC voltages measured by the A/D converter. These calibration waveforms are output by pulse generator 200 under the control of controller 211. The pulse generator is commanded into two combinations of pulse width and pulse period as shown in FIG. 3, and the average voltage of each (using lowpass filter output 208) is measured by A/D converter 209, and the equivalent A/D converter output 210 is routed to controller 211. Output 205 produced by the circuit using these two combinations is used to calculate the rise time caused by the rise time circuit 204 when the rise time D/A converter 201 is set to this particular value. The waveforms are represented in FIG. 3, and have the following characteristics:

Waveform 301 has a pulse width of t1.
Waveform 302 has a pulse width of t2.
Waveforms 301 and 302 have the same pulse period T1.
All waveforms have a resting voltage of K between pulses.
Waveform 301 has a peak voltage of Vpk1
Waveform 302 has a peak voltage of Vpk2.
All waveforms have a constant rate of voltage rise when the pulse generation circuit is putting out a "high" or "1" level pulse. This rate of voltage change (dV/dT) is generated by the rise time circuit 204 and is adjusted by the rise time D/A converter 201. The waveforms 301 and 302 represent output 205 as produced by the rise time circuit 204, fall time circuit 206, and pulse generator 200 combination, under the two pulse measurement conditions as set by software in controller 211.

When output 205 passes through lowpass filter 207, it generates lowpass filter output 208 that is the average voltage of that particular waveform. Vavg1 is the average voltage of waveform 301, Vavg2 is the average voltage of waveform 303.

The rise time is calculated knowing the characteristics of the waveforms being generated. First, the rising voltage forms a linear ramp rising from K volts to the peak voltage (Vpk1 or Vpk2). Pulse widths t1 and t2 are chosen small enough so that saturation does not occur in circuits 204 and 206. Another way of stating this is that every pulse will have a sharp peak at its maximum voltage and will not remain at the peak voltage for any significant period of time. A third way to understand this is to state that the rate of change of voltage during the rising edge of the output 205 is too slow to allow the waveform to reach any maximum value voltage limit imposed by the rise time circuit 204.

The calculation of rise time is based upon having pulses of the just-described characteristics. To measure rise-time the following sequence is performed:

1. The rise time D/A converter 201 is commanded to a numerical value whose corresponding rise time is to be measured.
2. The fall time D/A converter 203 is commanded to a very fast fall time. This fall time is known to be constant and much faster than the rise time being measured.
3. Pulse generator 200 is programmed to output no pulses, only the resting voltage K.

4. Resting voltage K now appears as output 205 and is passed through lowpass filter 207 to become lowpass filter output 208 which is the input of A/D converter 209. A/D converter 209 measures voltage K and routes the digital equivalent A/D converter output 210 to controller 211 which stores it for later use.
5. Pulse generator 200 is programmed by controller 211 to output pulses which are t1 wide at a pulse period of T1.
6. After waiting for the lowpass filter 207 to settle, A/D converter 209 makes an average DC Voltage measurement and sends it to controller 211. This is Vavg1.
7. The controller may now calculate the peak voltage Vpk1 of this waveforms using the following equation:

$$Vpk1=2(T1/t1)(Vavg1-K)+K$$

8. Pulse generator 200 is now programmed by controller 211 to output pulses t2 wide at a pulse period of T1.
9. After waiting for the lowpass filter 207 to settle, A/D converter 209 makes an average DC Voltage measurement and sends it to controller 211. This is Vavg2.
10. The controller may now calculate the peak voltage Vpk2 of this second waveform using the following equation:

$$Vpk2=2(T1/t2)(Vavg2-K)+K$$

11. Calculate the change in peak voltage per unit time using the following formula:

$$dVdT1=(Vpk2-Vpk1)/(t2-t1)$$

12. Calculate the 10% to 90% rise time (this is a standard definition for rise and fall times; there may be other applicable definitions) which corresponds to this D/A converter setting:

$$\text{rise time}=0.8/dVdt$$

The derivation of the above equations is as follows:
From geometry, the average voltage of waveform 301 is:

$$Vavg_1=K+\tfrac{1}{2}(V_{pk}-K)(t_1/T_1) \quad \text{(eqn 1)}$$

Where:
K=resting voltage between pulses
$V_{pk}$=Peak voltage attained during rising edge
$T_1$=Period of waveform
$t_1$=Pulse width
Rearrange to solve for $V_{pk}$:

$$V_{pk}=2(T_1/t_1)(V_{avg}-K)+K \quad \text{(eqn 2)}$$

A small refinement of the equation is added to allow for finite waveform "fall time". Since the voltage cannot move from Vpk to K at the end of the pulse in zero time, we add a small time tfall to the equation to correct the calculation for this non-zero fall time. It is assumed that tfall<<trise.

$$V_{pk}=2(T_1/(t_1+t_{fall}))(V_{avg}-K)+K \quad \text{(eqn 3)}$$

The process is now repeated for a second triangular waveform (302) with a longer pulse width.

$$V_{pk2}=2(T_1/(t_2+t_{fall}))(V_{avg2}-K)+K \quad \text{(eqn 4)}$$

Where:
K=baseline voltage
$V_{pk2}$=Peak Voltage at this longer pulse width
$T_1$=period of Waveform
$t_2$=longer pulse width
Note that fall time equations are derived in an analogous manner. Rise times only are presented by example.
Given the peak voltage of the waveforms, how fast the voltage rose from pulse width t1 to pulse width t2 may be calculated. Knowing the time difference between t1 and t2, it is possible to calculate the rate of voltage rise (dV/dT) which is defined as being the time it takes the voltage to change from 10% of final value to 90% of final value, or 80% of the total voltage change, for example.

A similar operation can be executed for any waveform shape (other than triangular) that can be adequately described in mathematical form.

After measuring the rise time of rise time circuit 204 at a certain rise time D/A converter 201 setting, the rise time calibration routine measures rise time at another D/A converter settings. To calculate the D/A converter setting required for a certain desired pulse rise time, the effective gain of the D/A converter is calculated in this operating region in units of rise time change per D/A converter count. This gain is multiplied by the rise time error (difference between the desired rise time and the measured rise time) and a new D/A converter setting is calculated. The new D/A converter setting is applied to the D/A converter, and the resulting rise time is measured using the recently described method. This process is repeated until an acceptably small level of error is achieved. This whole process is then repeated for as many calibration points (D/A converter codes versus rise times) as are required for calibration.

After calibration of the rise time, the process may be repeated for fall time calibration. The procedure is similar, except that fall time D/A converter 203 and fall time circuit 206 are utilized, and the rise time is set to the fastest value. As many fall time calibration points as are required may be taken.

Controller 211 stores the results of these calculations for later use in setting up desired rise time behavior, and these results may constitute part of the calibration profile of the host device. The results of those calculations can be stored for later use.

To summarize, the measurement of rise time and fall time may be considered in terms of geometric characteristics of the waveforms that result from the several pulse width and pulse period setups used. At the root of the technique is the geometric identity that the area of a right triangle is one-half the base times height of the triangle. In the waveforms measured, the "base" is the pulse width, and the "height" is the peak voltage that the waveform reaches above the resting value.

Knowing that the rate of voltage rise is linear (a characteristic of rise time circuit 204), we know the area of the triangle, and so the average voltage during the triangle part of the waveform is ½ t1(Vpk−K). The average voltage during one full period (T1) is then multiplied by the factor t1/T1 and added to the baseline voltage K to obtain the overall average. Since this mathematical model accurately represents the average voltage, we can inversely use the average voltage that we measure (Vavg) to calculate the peak voltage Vpk. A similar approach is used for fall time analysis.

The controllable factors are pulse width and pulse period, and the factor that we can measure is the average voltage of the waveform. The factor to be calculated is the rate of change of the voltage during the rising portion of the waveform. This technique will allow us to calculate this rate of change of voltage by measuring the average voltage under various width and period setups and using the average voltage measurements to calculate the peak voltage ("height") of the waveform. Using the peak voltage of the waveform, calculated at two different pulse widths, we can calculate the rate of change of the voltage with time, which can then convert into rise time with a simple calculation. A similar approach is used for fall times.

An example of the method is as follows:
1. Set up the rise time circuit to a condition we wish to measure.
2. Set up the pulse generator to a certain pulse period and pulse width (for example, period=500 nsec, width=120 nsec).
3. Measure average voltage generated by this waveform.
4. Calculate the peak voltage achieved during the known pulse width of this waveform. This peak voltage will be used later to calculate rise time in step 8.
5. Set up the pulse generator to the same pulse period and a different pulse width (for example, period=500 nsec, width=80 nsec).
6. Measure average voltage generated by this waveform.
7. As in step 4, calculate the peak voltage of this waveform from the average waveform voltage.
8. Using the peak voltage at 120 nanosecond pulse width (from step 4) and the peak voltage at 80 nanoseconds pulse width (from step 7) calculate the rate of change of voltage during the rising portion of the waveform. This is (peak voltage at 120 nanoseconds−peak voltage at 80 nanoseconds) divided by (120 nanoseconds−80 nanoseconds). This calculation yields the change in voltage over 40 nanoseconds, which is rate of change of volts per second (dV/dT).
9. Using the volts/second number, it is a matter of units conversion to calculate the rise time of the waveform that is exhibited by this rise-time setup of the circuit. Since rise time is defined to be the time required for the voltage to rise from the 10% level to the 90% level, in a standard definition of rise time of this example, the rise time of the circuit is 0.80*dVdT.

The particular numbers used for pulse width and period are not fixed and are only examples. They may be changed as required by host device characteristics and system requirements. The numbers cited are used in a specific apparatus, and are used to measure rise times from about 90 nanoseconds to about 500 nanoseconds. The minimum rise time to be measured and the saturation characteristics of rise time circuit 204 dictate the minimum pulse width used in the calibration technique. For example, we use 80 nanosecond pulse width to measure rise times above about 90 nanoseconds. If the voltage of the pulse reaches a circuit limit before the end of the pulse (width) then the geometry of the pulse will change and the measurement calculations will not be correct. (The pulse will become "flat" on top, and will no longer resemble the right triangle that the calculations require). An equivalent approach is used for fall times.

As can be seen, a host device incorporating the present invention does not require the use of external test equipment or external computers to perform automatic measurement and adjustment of rise and fall times. Operator assistance during the automatic sequencing is not required. Expensive external test equipment is not required.

Since the automatic sequence may be initiated at any time, it may be used to adjust for host device circuit changes due to environmental variations and aging.

It is a further benefit of the present invention that all measurements and adjustments required are contained within the host device and do not require a trained operator to initiate the automatic sequence. This eliminates human error and inefficiency while providing consistent accurate performance.

Those skilled in the art will appreciate that many other circuit and system configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, only rise time or fall time may be calibrated without departing from the invention. Many other variations are also possible. Accordingly, it is intended that the present invention embrace all such alternatives, modifications and variations as fall within the scope of the appended claims.

What is claimed is:

1. A method of calibrating rise times in a pulse generating system, comprising:
    measuring a first average voltage of the first test waveform;
    calculating a first peak voltage of the first test waveform;
    measuring a second average voltage of the second test waveform;
    calculating a second peak voltage of the second test waveform;
    using the first peak voltage and the second peak voltage, calculating the rate of change of voltage in a rising portion of the waveform;
    normalizing the rate of change of voltage to a value representative of a definition of rise time to obtain a rise time calibration point.

2. The method of claim 1, wherein the first test waveform and the second test waveform have fall times that are insignificant with respect to the first pulse width and the second pulse width, respectively.

3. The method of claim 1, wherein the first test waveform and the second test waveform may have any shape capable of being adequately represented mathematically.

4. The method of claim 1, wherein any number of rise times may be calculated by repeated application of the procedure.

5. The method of claim 1, wherein performing the method at any time to obtain more updated rise time calibration points.

6. The method of claim 1, further comprising:
    generating one or more rise time calibration points;
    storing the one or more rise time calibration points; and
    when a different rise time is required using the one or more rise time calibration points to generate the different rise time.

7. The method of claim 1, wherein the method nullifies one or more adverse effects of rise time errors due to environmental variations and component aging.

8. The method of claim 1, further comprising:
    configuring a pulse generator to output the first test waveform, of first pulse width and a known pulse period; and
    configuring the pulse generator to output the second test waveform, of second pulse width and the pulse period.

9. A method of calibrating fall times in a pulse generating system, comprising:
    measuring a first average voltage of the first test waveform;
    calculating a first peak voltage of the first test waveform;
    measuring a second average voltage of the second test waveform;
    calculating a second peak voltage of the second test waveform;

using the first peak voltage and the second peak voltage, calculating the rate of change of voltage in a falling portion of the waveform; and normalizing the rate of change of voltage to a value representative of a definition of fall time to obtain a fall time calibration point.

10. The method of claim 9, wherein the first test waveform and the second test waveform have rise times that are insignificant with respect to the first pulse width and the second pulse width, respectively.

11. The method of claim 9, wherein the first test waveform and the second test waveform may have any shape capable of being adequately represented mathematically.

12. The method of claim 9, wherein any number of fall times may be calculated by repeated application of the procedure.

13. The method of claim 9, wherein performing the method at any time to obtain more updated fall time calibration points.

14. The method of claim 9, further comprising:
generating one or more fall time calibration points;
storing the one or more fall time calibration points; and
when a different fall time is required using the one or more fall time calibration points to generate the different fall time.

15. The method of claim 9, wherein the method nullifies one or more adverse effects of fall time errors due to environmental variations and component aging.

16. The method of claim 9, further comprising:
configuring a pulse generator to output the first test waveform, of first pulse width and a known pulse period; and
configuring the pulse generator to output the second test waveform, of second pulse width and the pulse period.

17. A method allowing for independent calibration of rise and fall times in a pulse generating system, comprising:
measuring a first average voltage of a first waveform;
calculating a first peak voltage of the first waveform;
measuring a second average voltage of a second waveform;
calculating a second peak voltage of the second waveform;
using the first peak voltage and the second peak voltage to calculate a first rate of change of voltage in a rising portion of the waveform;
normalizing the first rate of change of voltage to a value representative of a definition of rise time to obtain a rise time calibration point;
measuring a third average voltage of a third waveform;
calculating a third peak voltage of the third waveform;
measuring a forth average voltage of a forth waveform;
calculating a forth peak voltage of the forth waveform;
calculating the fall time;
using the third peak voltage and the forth peak voltage to calculate a second rate of change of voltage in a falling portion of the waveform; and
normalizing the second rate of change of voltage to a value representative of a definition of fall time to obtain a fall time calibration point.

18. A system capable of performing rise time calibrations, comprising:
a pulse generator which accepts digital inputs and outputs analog pulses;
a rise time circuit capable of modifying the rise time of an analog input received from the pulse generator;
a lowpass filter coupled to the rise time circuit;
a conversion device coupled to the lowpass filter for converting analog to digital;
a controller capable of accepting digital inputs and supplying digital outputs, which is capable of mathematical computations; and
an interface circuit between the controller and the rise time circuit;
wherein the lowpass filter generates an average voltage of a waveform produced by the pulse generator and having a rise time supplied by the rise time circuit; wherein the controller calculates a rise time calibration point of the waveform from the average voltage of the waveform and a mathematical description of the waveform; and wherein the controller is operable to control the rise time circuit to change the rise time of the waveform in accordance with the rise time calibration point.

19. The system of claim 18, wherein the system is mounted in one host device.

20. The system of claim 18, wherein the system is not all mounted in one host device.

21. The system of claim 18, wherein the rise time circuit comprises one or more of current sources, pulse width modulators, variable resistance elements, variable capacitance elements, digital devices, analog to digital converters, and digital to analog converters.

22. The system of claim 18, wherein the lowpass filter comprises passive or active components.

23. The system of claim 18, wherein the conversion device comprises one or more of analog to digital converters, digital to analog converters, current sources, variable resistance elements, variable capacitive elements, and active and passive components.

24. The system of claim 18, wherein the controller comprises a processor.

25. The system of claim 18, wherein the controller is capable of storing and manipulating rise time calibration data.

26. The system of claim 18, wherein the interface circuit comprises one or more of digital to analog converters, analog to digital converters, current sources, variable resistance elements, and variable capacitive elements.

27. A system capable of performing fall time calibrations, comprising:
a pulse generator which accepts digital inputs and outputs analog pulses;
a fall time circuit capable of modifying the fall time of an analog input received from the pulse generator;
an lowpass filter coupled to the fall time circuit;
a conversion device coupled to the lowpass filter for converting analog to digital;
a controller capable of accepting digital inputs and supplying digital outputs, which is capable of mathematical computations; and
an interface circuit between the controller and the fall time circuit;
wherein the lowpass filter generates an average voltage of a waveform produced by the pulse generator and having a fall time supplied by the fall time circuit; wherein the controller calculates a fall time calibration point of the waveform from the average voltage of the waveform and a mathematical description of the waveform; and wherein the controller is operable to control the fall time circuit to change the fall time of the waveform in accordance with the fall time calibration point.

28. The system of claim 27, wherein the system is mounted in one host device.

29. The system of claim 27, wherein the system is not all mounted in one host device.

30. The system of claim 27, wherein the fall time circuit comprises one or more current sources, pulse width modulators, variable resistance elements, variable capacitance elements, digital devices, analog to digital converters, and digital to analog converters.

31. The system of claim 27, further comprising:
wherein the lowpass filter comprises passive or active components.

32. The system of claim 27, wherein the conversion device comprises one or more analog to digital converters, digital to analog converters, current sources, variable resistance elements, variable capacitive elements, and active and passive components.

33. The system of claim 27, wherein the controller comprises a processor.

34. The system of claim 27, wherein the controller is capable of storing and manipulating fall time calibration data.

35. The system of claim 27, wherein the interface circuit comprises one or more digital to analog converters, analog to digital converters, current sources, variable resistance elements, and variable capacitive elements.

36. A system capable of performing rise time and fall time calibrations, comprising:
a pulse generator which accepts digital inputs and outputs analog pulses;
a rise time circuit capable of modifying the rise time of an analog input received from the pulse generator;
a fall time circuit capable of modifying the fall time of an analog input received from the pulse generator;
a lowpass filter coupled to the rise time and fall time circuits;
a conversion device coupled to the lowpass filter for converting analog to digital;
a controller capable of accepting digital inputs and supplying digital outputs, which is capable of mathematical computations;
a first interface circuit between the controller and the rise time circuit;
a second interface circuit between the controller and the fall time circuit;
wherein to measure fall times the lowpass filter generates an average voltage of a first waveform produced by the pulse generator and having a fall time supplied by the fall time circuit; wherein the controller calculates a fall time calibration point of the first waveform from the average voltage of the first waveform and calculates the peak voltage of the first waveform from a mathematical description of the first waveform, and wherein the controller is operable to control the fall time circuit to change the fall time of a first future waveform in accordance with the fall time calibration point; and
wherein to measure rise times the lowpass filter generates an average voltage of a second waveform produced by the pulse generator and having a rise time supplied by the rise time circuit; wherein the controller calculates a rise time calibration point of the second waveform from the average voltage of the second waveform and calculates the peak voltage of the second waveform from a mathematical description of the second waveform, and wherein the controller is operable to control the rise time circuit to change the rise time of a second future waveform in accordance with the rise time calibration point.

37. The system of claim 36, wherein the system is mounted in one host device.

38. The system of claim 36, wherein the system is not all mounted in one host device.

39. The system of claim 36, wherein
the fall time circuit comprises one or more current sources, pulse width modulators, variable resistance elements, variable capacitance elements, digital devices, analog to digital converters, and digital to analog converters.

40. The system of claim 36, wherein
the rise time circuit comprises one or more current sources, pulse width modulators, variable resistance elements, variable capacitance elements, digital devices, analog to digital converters, and digital to analog converters.

41. The system of claim 36, further comprising:
wherein the lowpass filter comprises passive or active components.

42. The system of claim 36, wherein the conversion device comprises one or more analog to digital converters, digital to analog converters, current sources, variable resistance elements, variable capacitive elements, and active and passive components.

43. The system of claim 36, wherein the controller comprises a processor.

44. The system of claim 36, wherein the controller is capable of storing and manipulating fall time and rise time calibration data.

45. The system of claim 36, wherein either interface circuit comprises one or more digital to analog converters, analog to digital converters, current sources, variable resistance elements, and variable capacitive elements.

* * * * *

UNITED STATES PATENT AND TRADEMARK OFFICE
CERTIFICATE OF CORRECTION

| | | |
|---|---|---|
| PATENT NO. | : 7,027,945 B2 | Page 1 of 1 |
| APPLICATION NO. | : 10/743602 | |
| DATED | : April 11, 2006 | |
| INVENTOR(S) | : Kelly | |

It is certified that error appears in the above-identified patent and that said Letters Patent is hereby corrected as shown below:

On the face page, in field (73), in "Assignee", in column 1, line 2, delete "GA" and insert -- CA --, therefor.

Signed and Sealed this

Twenty-first Day of November, 2006

JON W. DUDAS
*Director of the United States Patent and Trademark Office*